(12) United States Patent
Takahashi et al.

(10) Patent No.: US 8,399,775 B2
(45) Date of Patent: Mar. 19, 2013

(54) FLEX-RIGID WIRING BOARD AND METHOD OF MANUFACTURING THE SAME

(75) Inventors: Michimasa Takahashi, Ogaki (JP); Masakazu Aoyama, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 442 days.

(21) Appl. No.: 12/403,220

(22) Filed: Mar. 12, 2009

(65) Prior Publication Data

US 2009/0242241 A1    Oct. 1, 2009

Related U.S. Application Data

(60) Provisional application No. 61/039,614, filed on Mar. 26, 2008.

(51) Int. Cl.
*H05K 1/00* (2006.01)
(52) U.S. Cl. .................................................. 174/254
(58) Field of Classification Search .............. 439/67, 439/77; 174/254; 361/749
See application file for complete search history.

(56) References Cited

U.S. PATENT DOCUMENTS

| | | | |
|---|---|---|---|
| 2005/0168957 A1* | 8/2005 | Kawauchi et al. | 361/749 |
| 2007/0107006 A1 | 5/2007 | Chen et al. | |
| 2008/0204998 A1* | 8/2008 | Matsui | 361/695 |

FOREIGN PATENT DOCUMENTS

| | | |
|---|---|---|
| EP | 1 783 588 A1 | 5/2007 |
| EP | 1 858 306 A1 | 11/2007 |
| EP | 1 951 016 | 7/2008 |
| JP | 07-079089 | 3/1995 |
| JP | 2003-133734 | 5/2003 |
| JP | 2006/073819 | 3/2006 |
| JP | 2006-216593 | 8/2006 |
| JP | 2006-253304 A | 9/2006 |
| JP | 2006-324406 | 11/2006 |
| JP | 2007-258593 | 10/2007 |
| JP | 4021472 | 10/2007 |
| JP | 4024846 | 12/2007 |
| JP | 2008-016672 | 1/2008 |

OTHER PUBLICATIONS

European Search Report issued May 16, 2012, in connection with counterpart European Patent Application No. 08873646.7.

* cited by examiner

*Primary Examiner* — Khiem Nguyen
(74) *Attorney, Agent, or Firm* — Oblon, Spivak, McClelland, Maier & Neustadt, L.L.P.

(57) ABSTRACT

A flex-rigid wiring board includes a first rigid substrate, a second rigid substrate arranged at a distance from the first rigid substrate to provide a space between the first and second rigid substrates and a flexible substrate. The flexible substrate includes a first tip portion connected to the first rigid substrate, and a second tip portion connected to the second rigid substrate such that the first and second rigid substrates are connected to each other by way of the flexible substrate. At least one bending portion is formed between the first and second tip portions of the flexible substrate, each of the at least one bending portions is provided in the space between the first and second rigid substrates.

20 Claims, 12 Drawing Sheets

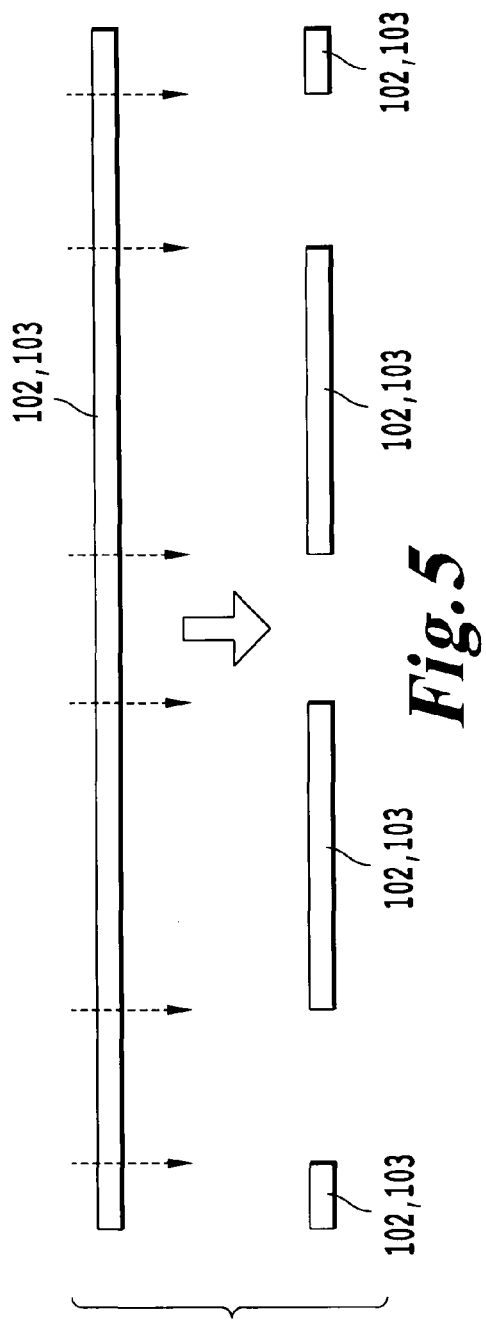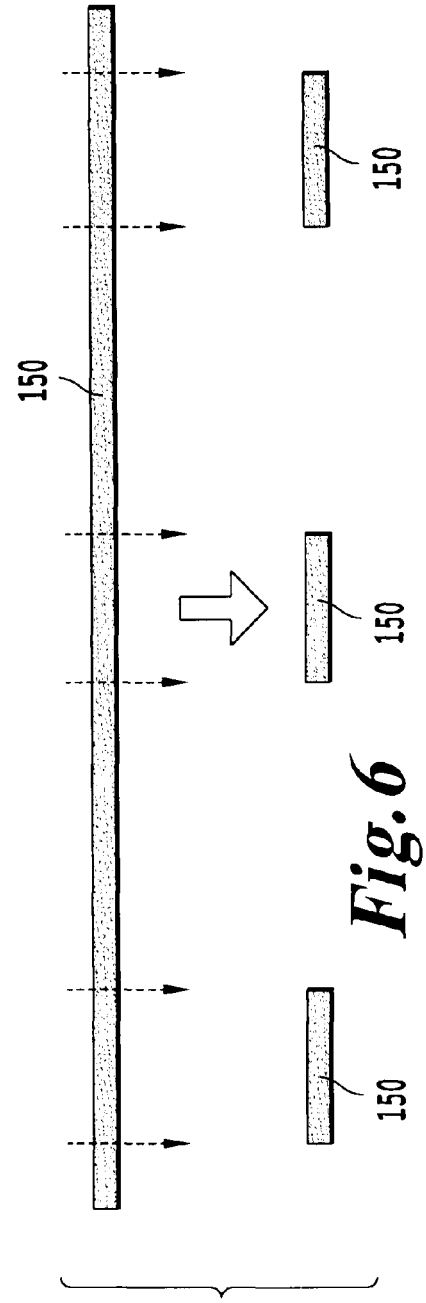

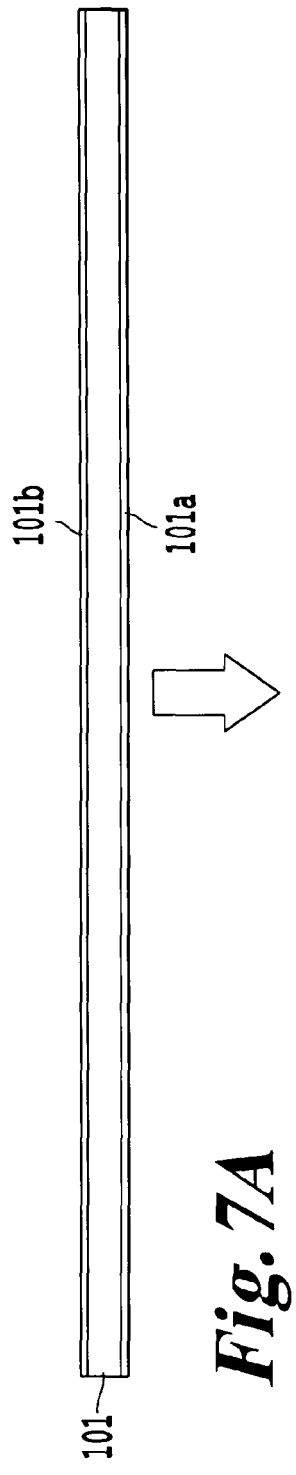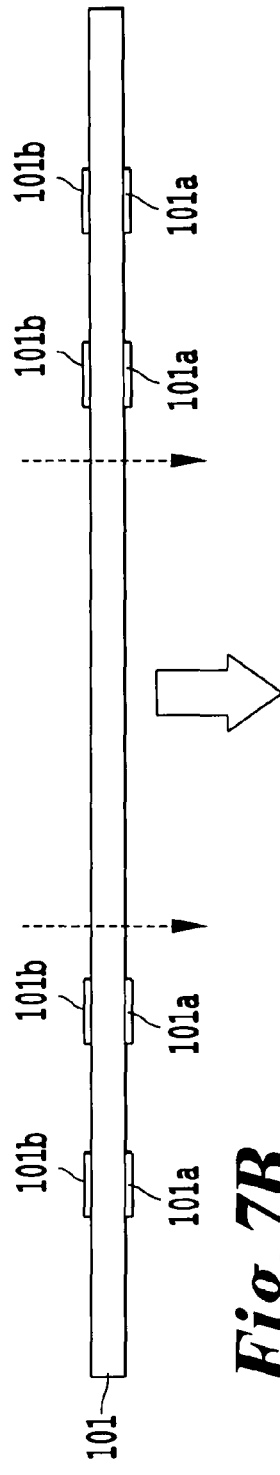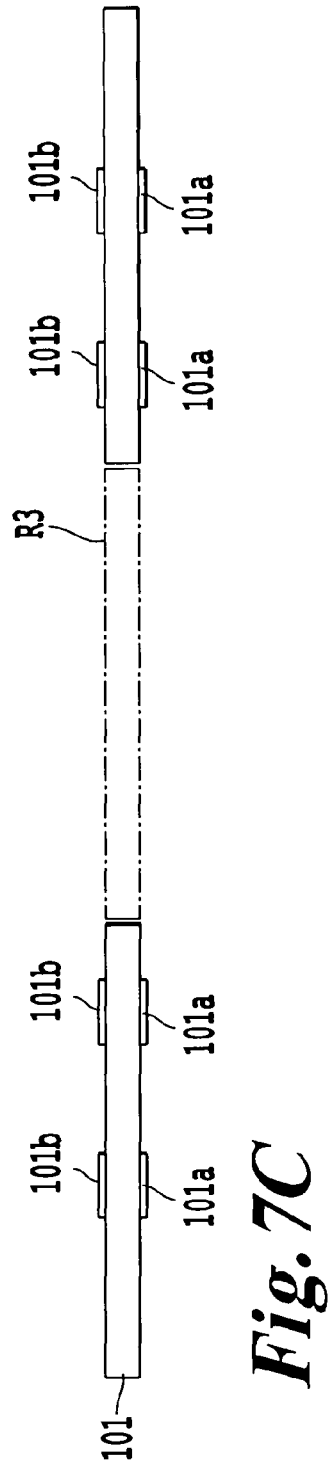

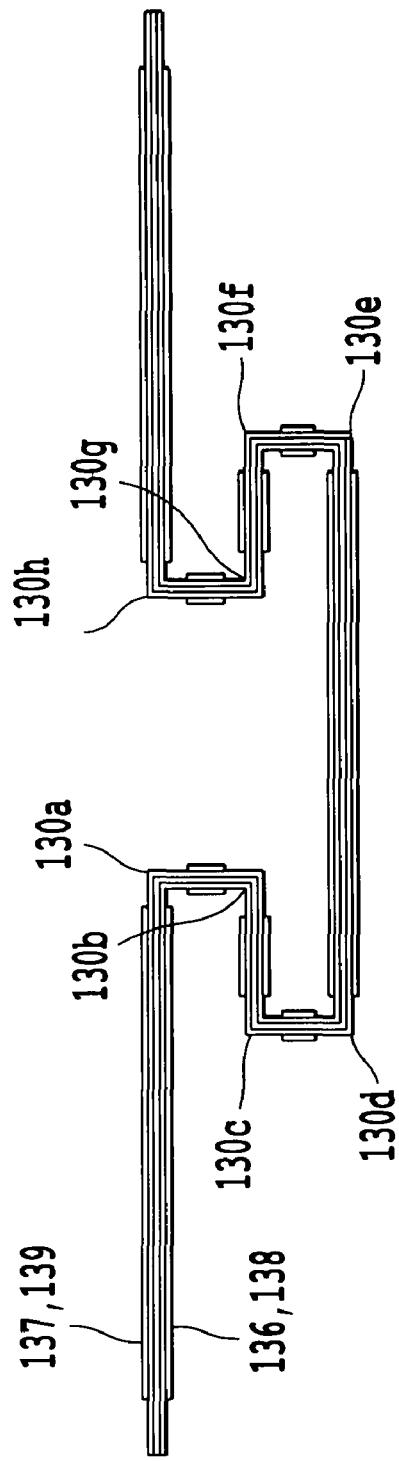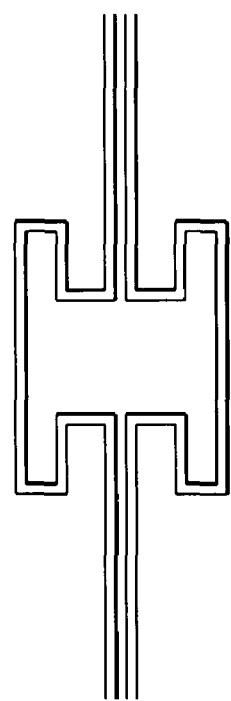

FLEX-RIGID WIRING BOARD AND METHOD OF MANUFACTURING THE SAME

CROSS-REFERENCE TO RELATED APPLICATIONS

This non-provisional application claims the benefit of U.S. Provisional Application No. 61/039,614, filed Mar. 26, 2008. The entire content of that application is incorporated herein by reference.

BACKGROUND OF THE INVENTION

1. Technical Field

The present invention is related to a flex-rigid wiring board, and manufacturing method for a flex-rigid wiring board, which is structured with a non-flexible rigid substrate and a bendable flexible substrate.

2. Description of Related Art

A flex-rigid wiring board has a section (rigid substrate) that has sufficient rigidity and strength to bear the weight of a loaded component, and a bendable section (flexible substrate) as well. This configuration allows an electronic device to be compact and light-weight, and allows its wiring to be highly integrated and reliable. Thus, the flex-rigid wiring board is widely used in electronic apparatuses such as cell phones and automobile equipment. However, it is desirable to improve the manufacturing process by reducing waste, and to improve the reliability of flex-rigid wiring boards.

BRIEF SUMMARY OF EMBODIMENTS OF THE INVENTION

In one aspect of the invention, a flex-rigid wiring board includes a first rigid substrate, a second rigid substrate arranged at a distance from the first rigid substrate to provide a space between the first and second rigid substrates and a flexible substrate. The flexible substrate includes a first tip portion connected to the first rigid substrate, and a second tip portion connected to the second rigid substrate such that the first and second rigid substrates are connected to each other by way of the flexible substrate. At least one bending portion is formed between the first and second tip portions of the flexible substrate, each of the at least one bending portions is provided in the space between the first and second rigid substrates.

Another aspect of the invention includes a method for manufacturing a flex-rigid wiring board having a plurality of rigid substrates and a flexible substrate connecting the rigid substrates with each other. The method includes forming at least one bending portion in the flexible substrate, and forming a predetermined accommodation space by removing at least part of insulative material formed on the back or front of the rigid base material as part of the rigid substrate. The flexible substrate, including its bending portions, is accommodated in a space between the plurality of rigid substrates by using a space between the rigid base materials and the predetermined accommodation space formed.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. (1A) is a plan view illustrating a flex-rigid wiring board according to an embodiment of the present invention, and FIG. (1B) is a side view of the wiring board of FIG. (1A).

FIG. 5 is a cross-sectional view illustrating an example of a manufacturing process according to the manufacturing method for an embodiment.

FIG. 6 is a cross-sectional view illustrating an example of a manufacturing process according to the manufacturing method for an embodiment.

FIGS. 7A, 7B and 7C are cross-sectional views illustrating an example of a process flow according to a manufacturing method of an embodiment.

FIG. 9 is a view illustrating another example of a flexible substrate.

FIG. 10 is a view illustrating yet another example of a flexible substrate.

DETAILED DESCRIPTION OF THE EMBODIMENTS

Figure 1A:
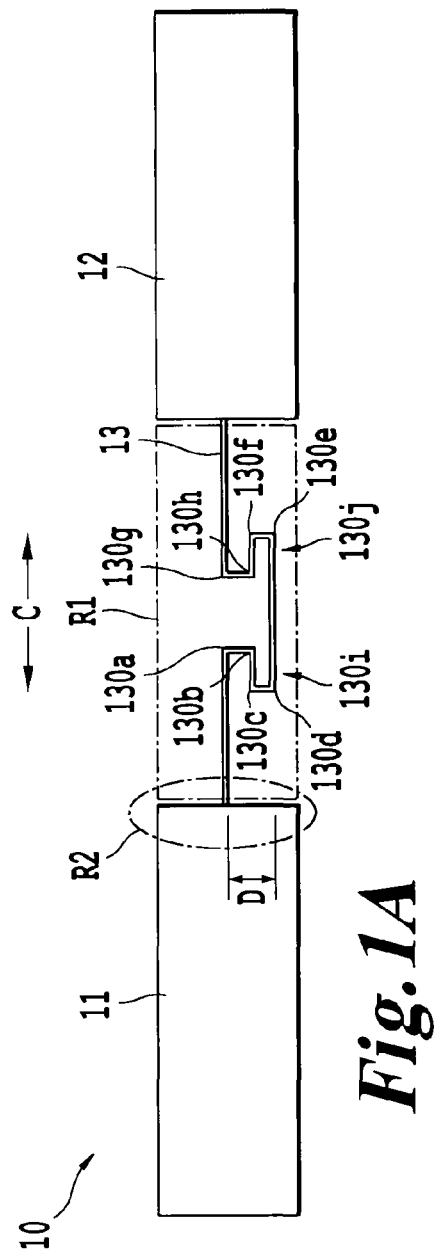

As noted above, it is desirable to improve the manufacturing process of a flexible rigid wiring board by reducing waste, and to improve reliability of flex-rigid wiring boards. In such boards, rigid substrates are each formed as a multilayer substrate having multiple conductive layers which each have a circuit formed thereon. A flexible substrate with a predetermined wiring pattern is bridged between rigid substrates to electrically connect the rigid substrates.

A flex-rigid wiring board in which rigid substrates and flexible substrates are integrated to form one structure is known, for example, in Japanese Laid-Open Patent Publication 2006-324406, the entire content of which is incorporated herein by reference. The flex-rigid wiring board of this document is formed by alternately stacking planar sheets of rigid and flexible material, and then removing the rigid material from a center portion of the board such that a flexible substrate is provided to bridge between two rigid substrates. The present inventors have recognized, however, that alternate stacking of the rigid and flexible material causes the rigid boards to be increased in thickness by the number of alternately stacked flexible layers. Further, this conventional method removes a large amount of rigid material to provide the flexible portion, which increases the cost of this wiring board.

It has also been suggested to manufacture a rigid-flex wiring board by producing the rigid substrates and flexible substrates separately, and then joining them in a single structure. This type of wiring board employs a structure in which the tips of a flexible substrate are sandwiched between layers of the rigid substrate, thus reducing problems such as connection problems, compared with a case in which the rigid substrates are connected by a connector or the like.

However, even if a flex-rigid wiring board is manufactured so that rigid substrates and flexible substrates are separately prepared and then connected, material is wasted during the manufacturing process. For example, a portion of rigid substrate removed to secure space for a flexible substrate is wasted. Especially, if a flexible substrate is made long, more rigid-substrate material is needlessly consumed than with a shorter flexible substrate. Accordingly, the number of products to be made per unit of material substantially decreases.

One objective of embodiments of the invention is to provide a flex-rigid wiring board and manufacturing method which provides more effective use of material, so that more products may be produced per unit of material.

To achieve such an objective, a flex-rigid wiring board according to a first aspect of the invention is structured with two or more non-flexible substrates (11, 12), and a flexible substrate (13) which connects the non-flexible substrates with each other. The flexible substrate has one or more bending portions and is accommodated, including its bending portions, in a space (R1) between the multiple non-flexible substrates.

Also, a method of manufacturing a flex-rigid wiring board according to the second aspect of the present invention is to manufacture non-flexible substrates (11, 12) each having non-flexible base material (101), and provide a flexible substrate (13) which connects the non-flexible substrates to each other. The method is made up of a first step to form one or more bending portions in the flexible substrate, and a second step to form a predetermined accommodation space by removing a portion from at least either first insulative material (102) or second insulative material (103) formed on the back and front of the non-flexible base material (101) as part of the non-flexible substrate. A third step is to accommodate the flexible substrate, including its bending portions formed in the first step, in space (R1) between the non-flexible substrates by using a space between the non-flexible base materials of the multiple non-flexible substrates and the accommodation space formed in the second step.

The embodiments will now be described with reference to the accompanying drawings, wherein like reference numerals may designate corresponding or identical elements throughout the various drawings. In the following, an embodiment is described regarding a flex-rigid wiring board and its manufacturing method according to an example of the present invention.

As shown in FIGS. (1A) and (1B), flex-rigid wiring board (10) has first and second rigid substrates (11, 12), which are non-flexible substrates having non-flexible features. Bendable flexible substrate (13) is formed separately from rigid substrates (11, 12) and connects the substrates (11, 12) with each other. That is, flexible substrate (13) is a connection material to connect rigid substrates (11, 12). Each tip of the flexible substrate 13 is connected to rigid substrates (11, 12) respectively, and the flexible substrate 13 is accommodated in space (R1) (corresponds to a space between the cut surfaces) formed by processing a rigid substrate (before it is cut into substrates (11, 12)). Accordingly, flexible substrate (13) is placed in a horizontal direction to rigid substrates (11, 12) (a direction parallel to the back and front surfaces of the rigid substrates).

Any circuit pattern is formed on each of first and second rigid substrates (11, 12), and striped wiring (13a) is formed on flexible substrate (13) so as to connect a circuit pattern on first rigid substrate (11) to a circuit pattern on second rigid substrate (12). More specifically, connection pad (13b) is formed on each tip of wiring (13a), and circuit patterns on first and second rigid substrates (11, 12) are electrically connected to wiring (13a) through connection pads (13b). Electronic components, such as a semiconductor chip, may be connected to rigid substrates (11, 12) according to requirements. As seen in FIG. 1A, the flex-rigid wiring board (10) has flexible substrate (13) which has bending portions (130a-130h).

Figure 1B:
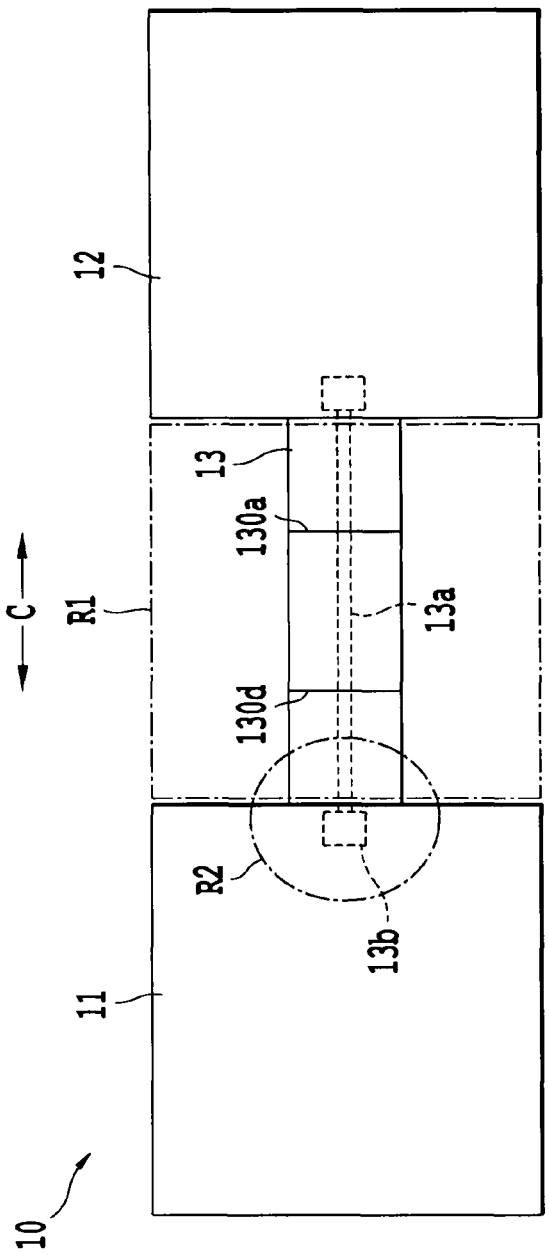

FIG. (2) is a cross-sectional view illustrating the structure of flexible substrate (13) before the bending process. As shown in FIG. (2), flexible substrate (13) is formed by laminating conductive layers (132, 133), insulation layers (134, 135), shield layers (136, 137) and coverlays (138, 139) in that order on respective back and front surfaces of base material (131). Base material (131) is formed with an insulative flexible sheet, for example, a polyimide sheet with a thickness of 20-50 μm, preferably an approximate thickness of 30 μm. Conductive layers (132, 133) are formed respectively on the back and front surfaces of base material (131) to make the above striped wiring pattern (13a) (FIG. 1B). Conductive layers (132, 133) are formed with, for example, a copper pattern with an approximate thickness of 5-15 μm.

Insulation layers (134, 135) are formed with, for example, a polyimide film with an approximate thickness of 5-15 μm, and insulate conductive layers (132, 133) from the outside. Shield layers (136, 137) are formed with a conductive material, for example, a cured silver-paste film, and have a function to shield conductive layers (132, 133) from external electromagnetic noise as well as to shield electromagnetic noise from conductive layers (132, 133) to outside. Coverlays (138, 139) are formed with, for example, an insulative polyimide film with an approximate thickness of 5-15 μm, and have a function to electrically insulate the entire flexible substrate (13) as well as to protect the entire flexible substrate (13) from outside.

A bending process is conducted on the straight flexible substrate (13), having the structure described above, to configure it as shown in FIG. (1A). Namely, flexible substrate (13) is folded at eight bending portions (130a-130h), which are each bent at a substantially right angle. Further, the flexible substrate 13 protrudes by the folded size (protrusion length "D") toward the back side of the substrate as shown in FIG. (4). Also, overlapped portions (130i, 130j) are formed by folding, and folding back, the flexible substrate a total of four times in the direction of "C" (corresponds to a longitudinal direction of flexible substrate (13)) toward the joints with rigid substrates (11, 12). With this arrangement, the flexible substrate extends between the rigid substrates. Flexible substrate (13), including its folded portions (folded section), is entirely accommodated between first and second rigid substrates (11, 12), namely in space "R1" shown in FIG. 1B.

Next, referring to FIG. (3), the structure of the joint sections between rigid substrates (11, 12) and flexible substrate (13) is described, taking as an example the joint section between rigid substrate (11) and flexible substrate (13). FIG. (3) is an enlarged cross-sectional view of region (R2) shown in FIG. (1A). As shown in FIG. (3), rigid substrate is formed by laminating first insulation layers (102, 103) and second insulation layers (104, 105) in that order on respective back and front surfaces of non-flexible base material (101).

Non-flexible base material (101) is made of non-flexible insulative material, such as glass-epoxy resin, so as to provide rigidity for rigid substrate (11). Further, non-flexible base material (101) is arranged parallel (in a horizontal direction) to the surface of flexible substrate (13) such that an end of the base material does not touch an end of the flexible substrate. Non-flexible base material (101) is formed to have substantially the same thickness as that of flexible substrate (13), for example, in the range of 50-150 μm, preferably an approximate thickness of 100 μm.

First insulation layers (102, 103) have a thickness, for example, in the range of 50-100 μm, preferably an approximate thickness of 50 μm, and cover the front and back surfaces of non-flexible base material (101) and flexible substrate (13) respectively. Insulation layers (102, 103) are formed by, for example, curing a prepreg. The prepreg is preferred to be a resin with low-flow characteristics. Such a prepreg may be made by impregnating glass cloth with epoxy resin and thermosetting the resin beforehand so as to advance the curing degree to a semi-cured stage. Such a prepreg may also be made by impregnating glass cloth with a highly viscous resin, or by impregnating glass cloth with a resin containing inorganic filler such as silica filler, or by reducing the amount of the resin used to impregnate glass cloth.

As seen in FIG. (3) flexible substrate (13) and rigid substrate (11) are joined through polymerization of coverlays (138, 139) and first insulation layers (102, 103). Flexible substrate (13) is supported and anchored in such a way that its tip is substantially surrounded by non-flexible base substrate (101) forming the core of rigid substrate (11), and first insulation layers (102, 103). Furthermore, resin (111) is filled in a gap formed between insulation layers (102, 103) when they sandwich a tip of flexible substrate (13). Specifically, since shield layers (136, 137) and coverlays (138, 139) are not formed in the contact electrically connected portions where conductive layers (132, 133) and upper-layer wiring area, a gap is formed between insulation layer (103) and flexible substrate (13). A gap is also formed between an end of non-flexible base material (101) and an end of flexible base material (13). Resin (111) is filled in each gap. Resin (111) seeps, for example, from the low-flow prepreg that forms first insulation layers (102, 103) at the time of manufacturing, and the resin is cured to be integrated with insulation layers (102, 103).

Figure 3:
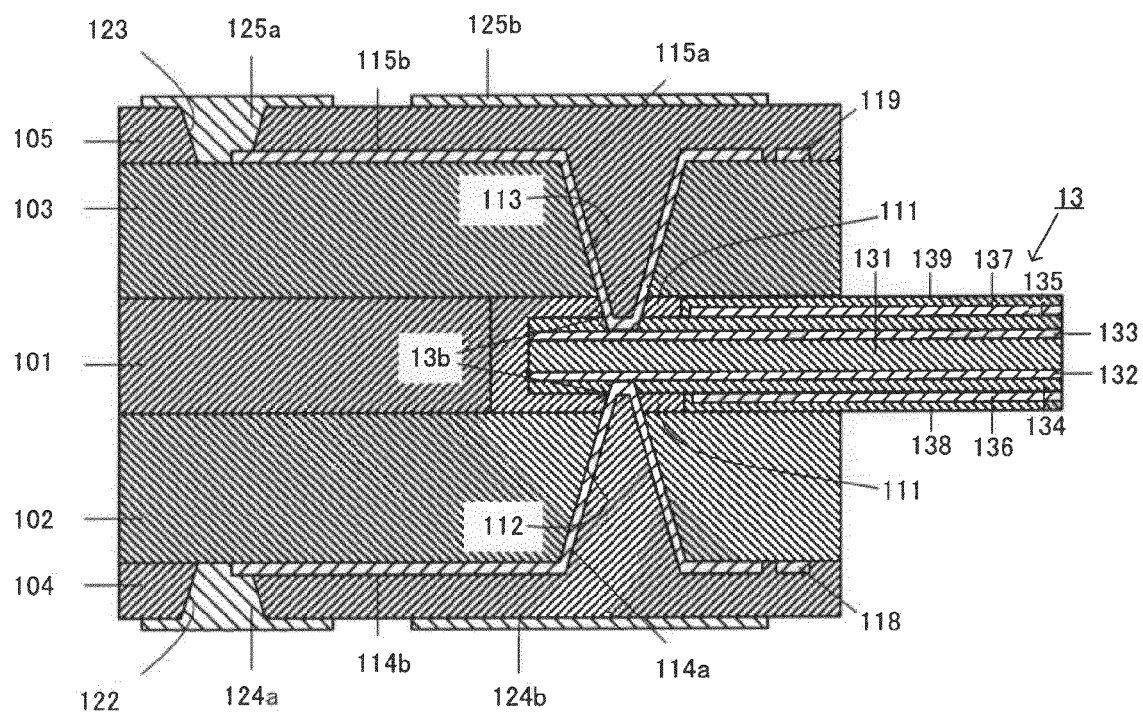
FIG. 3 is a cross-sectional view illustrating the structure of a joint section between a non-flexible substrate and a flexible substrate.

Vias (via holes, contact holes) (112, 113) are formed in insulation layers (102, 103), penetrating the insulation layers and reaching conductive layers (132, 133) respectively (although physical contact is not shown in FIG. 3). Vias (112, 113) are formed in the area facing connection pads (13b) (FIG. 1B) so as to expose connections pads (13b) of conductive layers (132, 133) (that correspond to wiring (13a) shown in FIG. 1B). Wiring patterns (conductive layers) (114b, 115b), are positioned on the surfaces of insulation layers (102, 103) and formed with copper plating or the like. These wiring patterns are connected through plating to exposed connection pads (13b) by means of extended patterns (conductors for connection) (114a, 115a). After first insulation layers (102, 103) and vias (112, 113) are formed, wiring patterns (114b, 115b) and extended patterns (114a, 115a) are formed, for example, by lamination and patterning so as to make a film that covers each surface of insulation layers (102, 103) and the surfaces (etching surfaces) of vias (112, 113).

In flex-rigid wiring board (10), wiring patterns (114b, 115b) and conductive layers (132, 133) are electrically connected to each other. Also, on each surface of first insulation layers (102, 103), copper patterns (118, 119), insulated from the other parts, are formed. By doing so, the heat generated in rigid substrate (11) may be effectively released.

On a surface of each first insulation layer (102, 103), second insulation layers (104, 105) are laminated respectively in such a way to fill in vias (112, 113) as well as to cover wiring patterns (114b, 1115b). Insulation layers (104, 105) are formed by curing a prepreg made by impregnating glass cloth or the like with material (such as resin) containing inorganic material. By forming such a structure, tolerance to the impact of being dropped may be enhanced. Vias (112, 113) are filled with the resin from the prepreg during a manufacturing step for the flex-rigid wiring board.

In second insulation layers (104, 105), vias (122, 123) are formed respectively, and are connected to wiring patterns (114b, 115b). Vias (122, 123) and are filled with conductors (124a, 125a) made of copper, for example. Moreover, on each surface of second insulation layers (104, 105), conductive patterns (circuit patterns) (124b, 125b) are each properly formed. Then, conductive patterns (124b, 125b) become electrically connected to conductors (124a, 125a) through connection to vias (122, 123). As such, in flex-rigid wiring board (10), build-up vias are formed.

The joint section between rigid substrate (11) and flexible substrate (13) has been described above. Since the joint section between rigid substrate (12) and flexible substrate (13) has substantially the same structure, its description is omitted here.

A flex-rigid wiring board according to the embodiment described above has the following effects.

(1) Flex-rigid wiring board (10) is made up of non-flexible substrates (rigid substrates 11, 12), and a flexible substrate (flexible substrate 13) which connects rigid substrates (11, 12) with each other. In flex-rigid wiring board (10), flexible substrate (13) has multiple bending portions (bending portions 130a-130h) and is accommodated, including bending portions (130a-130h), between rigid substrates (11, 12) in space (R1) shown in FIG. 1B. In such a structure, by having bending portions (130a-130h), flexible substrate (13) can be accommodated in a small space. Accordingly, the length of non-flexible base material (101) to be removed to make space for accommodating flexible substrate (13) can decrease, and thus more products may be manufactured per unit of material.

(2) In flex-rigid wiring board (10), rigid substrates (11, 12) are formed with non-flexible base material (101), first insulative material (first and second insulation layers 102, 104) and second insulative material (first and second insulation layers 103, 105) formed in that order on respective back and front surfaces of non-flexible base material (101). Flexible substrate (13) is accommodated in space (R1) between rigid substrates (11, 12) by removing part of first and second insulation layers (102, 104). Flexible substrate (13) has a folded section formed with bending portions (130a-130h) on its back surface, which protrudes by the size of the folded section. Structured as such, the protruding folded section may easily be accommodated by removing part of first and second insulation layers (102, 104).

(3) In flex-rigid wiring board (10), each tip of flexible substrate (13) is anchored in such a way that it is sandwiched between first insulation layers 102 and 103 using non-flexible base material (101) as a spacer (see FIG. 3). In doing so, problems such as connection problems, seldom occur in contrast to cases in which rigid substrates (11, 12) and flexible substrate (13) are connected using a connector or the like.

(4) In flex-rigid wiring board (10), bending portions (130a-130h) form a folded section. Flexible substrate (13) with such a folded section vibrates when it is dropped, which converts impact energy of the fall to kinetic energy. Accordingly, the impact of being dropped, especially the impact exerted on the joint section between rigid substrates (11, 12) and flexible substrate (13), decreases. Thus, the connection reliability of those substrates may be improved.

(5) In flex-rigid wiring board (10), flexible substrate (13) is folded and folded back an even number of times at bending portions (130a-130h) in a direction parallel to the joints with rigid substrates (11, 12). Having such a structure, the above folded section may be formed without making cuts or the like, and thus a simple structure may be maintained.

Next, a method of manufacturing flex-rigid wiring board (10) is described with reference to FIGS. (4)-(8). First, a method to manufacture flexible substrate (13), and then a method to join rigid substrates (11, 12) and flexible substrate (13) is each described.

Figure 2:
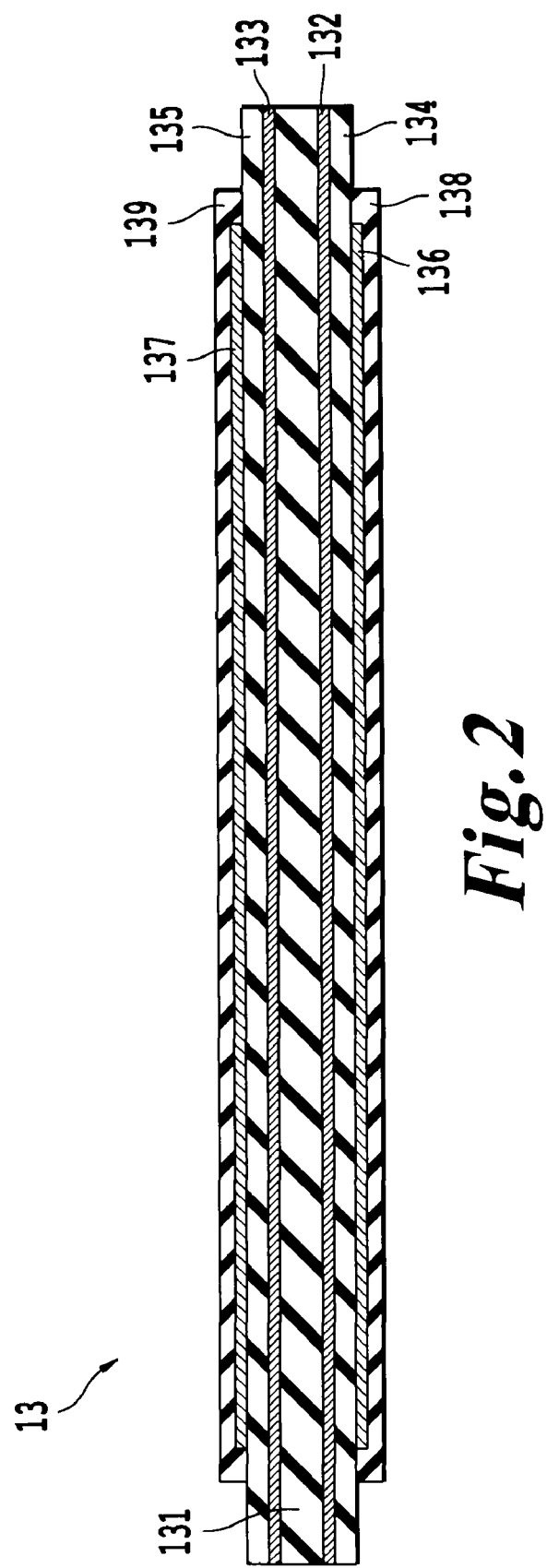
FIG. 2 is a cross-sectional view illustrating the structure of a flexible substrate before a bending process.

Regarding manufacturing flexible substrate (13) (FIG. 2), first, a copper film is disposed on both surfaces of polyimide base material (131), which is processed to be a predetermined size. Next, by patterning the copper film, conductive layers (132, 133), each having wiring pattern (13a) and connection pad (13b), are formed. Then, on each surface of conductive layers (132, 133), insulation films (134, 135) made of a polyimide layer or the like are formed by lamination respectively. On insulation films (134, 135), except for the tips of flexible substrate (13), silver paste is applied, then the applied silver paste is cured to form shield layers (136, 137). Furthermore, to cover each surface of shield layers (136, 137), coverlays (138, 139) are formed. Through such series of steps, flexible substrate (13) having a structure shown in FIG. (2) is completed. As noted shield layers (136, 137) and coverlays (138, 139) are formed except in the area of connection pads (13b).

A large wafer having such a laminated structure is generally used as a common material to provide multiple products. Namely, as shown in FIG. (4), for example, a wafer is severed (cut) to a predetermined size using a laser or the like, and flexible substrate (13) with a predetermined size is obtained. Then, by utilizing its flexibility, substrate (13) is folded using, for example, a predetermined jig or the like, to make a configuration such as that shown in FIGS. (1A) and (1B).

Next, a method to join rigid substrates (11, 12) and flexible substrate (13) is described. As shown in FIG. (5), a wafer that is common to multiple products is cut, for example, by a laser or the like, to form first insulation layers (102, 103) with a predetermined size. Similarly, as shown in FIG. (6), separators (150) to be used for joining are prepared by cutting to a predetermined size a wafer common to multiple products using, for example, a laser or the like. As the size of the spacer 150 and the size of a removed wafer portion to form insulation layers 102, 103 is based on the accommodation space of the flexible substrate, folding of the flexible substrate to occupy a smaller size can result in reduced material waste.

Figure 8A:
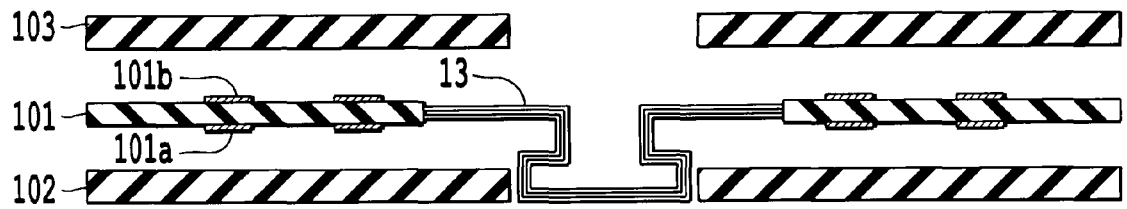
FIGS. 8A, 8B, 8C, 8D, 8E, 8F, 8G, 8H and 8I are cross-sectional views illustrating an example of a process flow according to a manufacturing method of an embodiment.
Figure 8B:
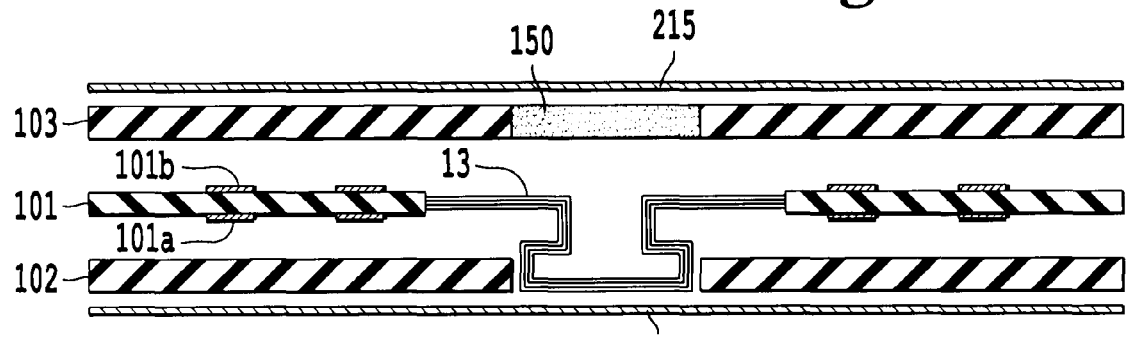
Figure 8C:
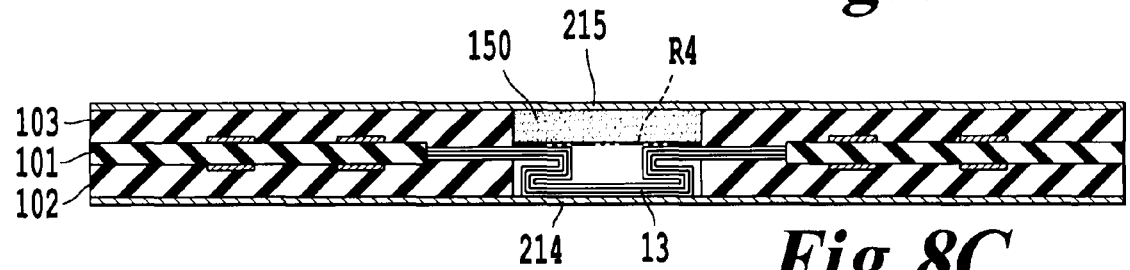
Figure 8D:
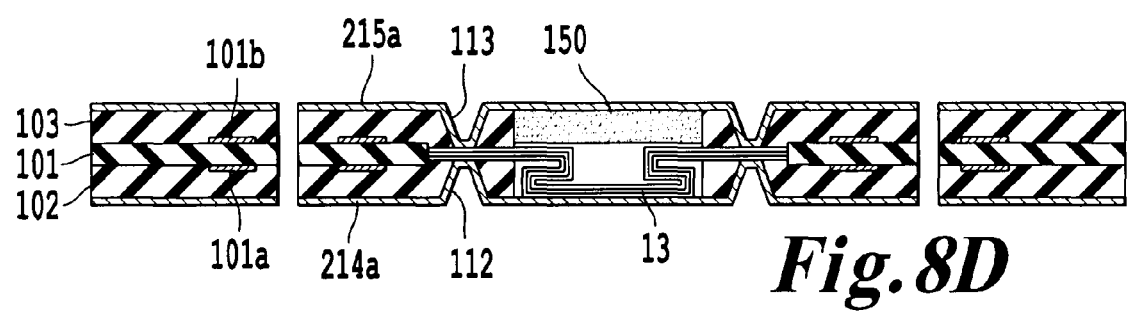
Figure 8E:
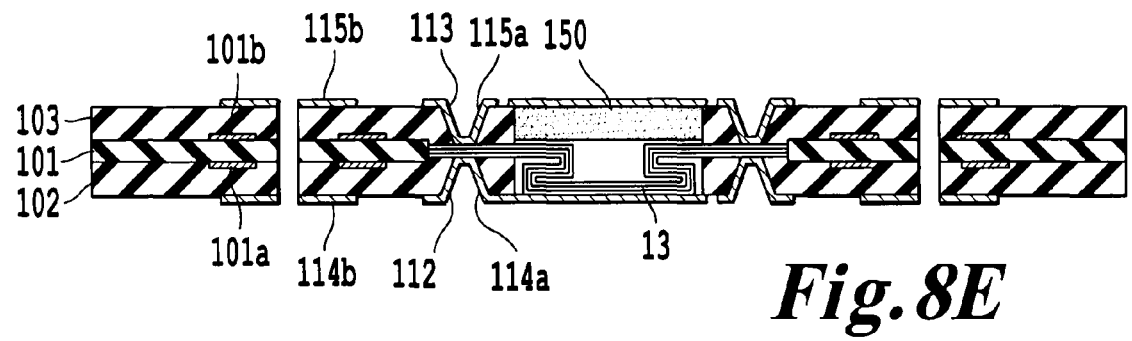
Figure 8F:
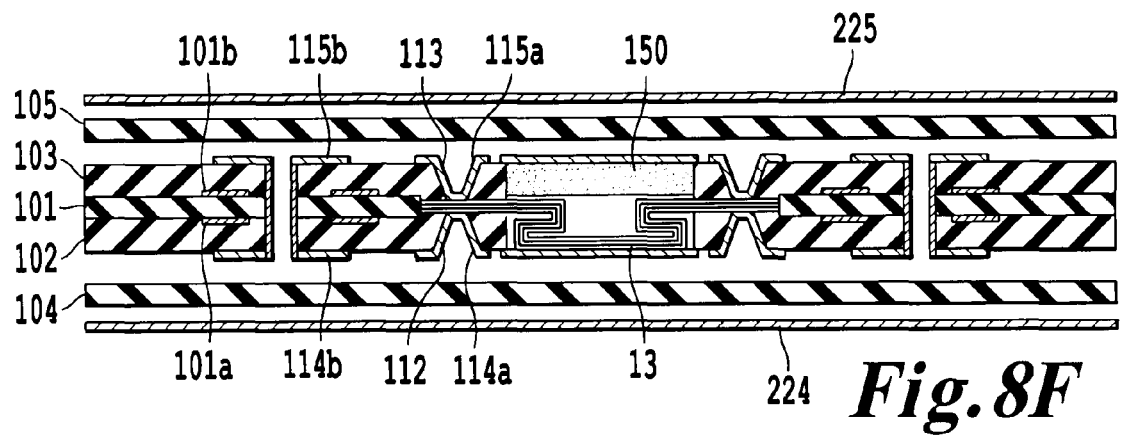
Figure 8G:
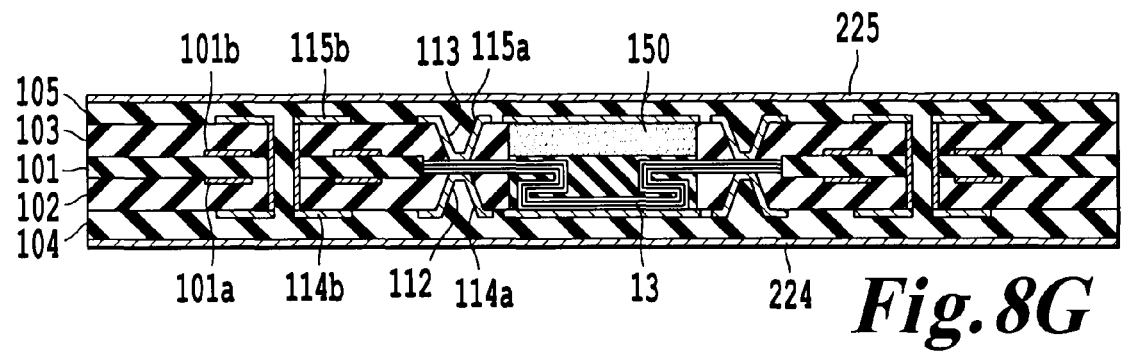
Figure 8H:
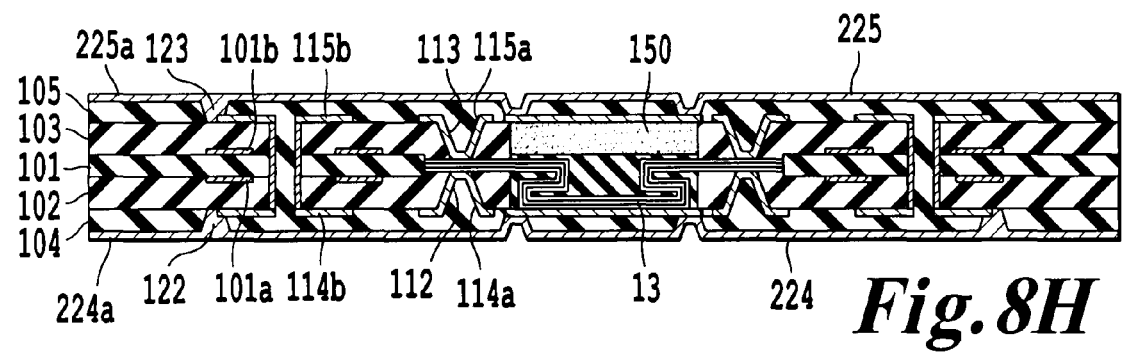

The thickness of first insulation layers (102, 103) is set to correspond to protruded length "D" of FIG. (4) so that flexible substrate (13), including its folded section, is accommodated between rigid substrates (11, 12) (more precisely, between non-flexible base material (101) and first insulation layers (102, 103)) after the later pressing step (FIG. 8C). In the present embodiment, to make rigid substrates (11, 12) a symmetrical structure in their front and back, the thickness of first insulation layers (102, 103) is set to be substantially the same. Also, the thickness of separator (150) is set to be substantially the same as that of first insulation layers (102, 103).

On the front and back of non-flexible base material (101), which is to become the core of rigid substrates (11, 12), conductive films (101a, 101b) made of, for example, copper, are formed respectively as shown in FIG. (7A). Then, for example, a predetermined photo-etching process, such as prior treatment, laminate, expose to light, develop, etch, remove, inspect inner layers, etc., is performed on conductive films (101, 101b) to form predetermined conductive patterns (101a, 101b) respectively as shown in FIG. (7B). As shown in FIG. (7C), predetermined section (R3) is removed from non-flexible base material (101) using, for example, a laser, to obtain non-flexible base material (101) for each of rigid substrates (11, 12). As the size of material removed R3 is based on the accommodation space of the flexible substrate, folding of the flexible substrate to occupy a smaller space can reduce material waste.

Figure 4:
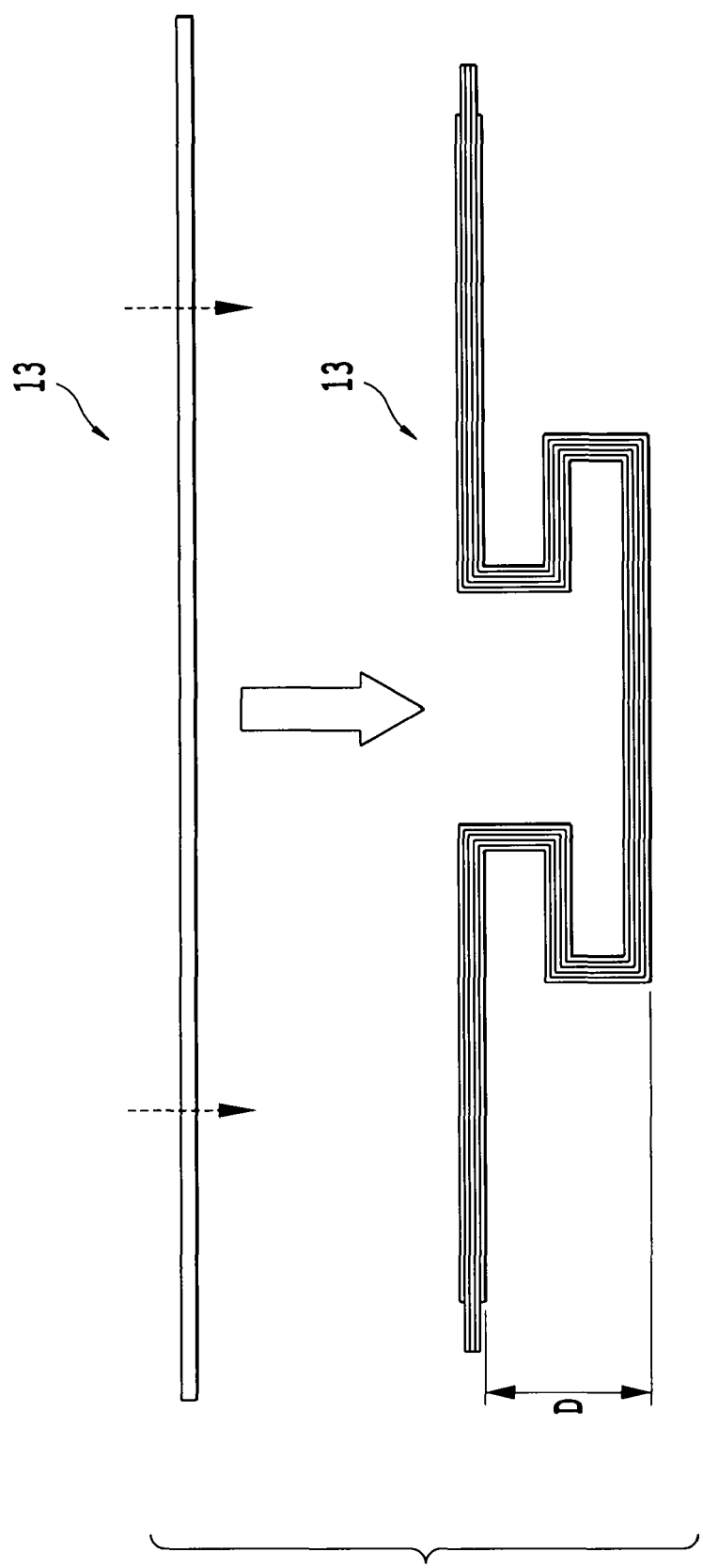
FIG. 4 is a cross-sectional view illustrating an example of a manufacturing process according to an embodiment of the manufacturing method for a flex-rigid wiring board of the present invention.

Next, as shown in FIG. (8A), non-flexible base material (101), the above cut flexible substrate (13) (FIG. 4) and first insulation layers (102, 103) (FIG. 5) are aligned to be assembled. More specifically, regarding rigid substrates (11, 12), non-flexible base material (101) and first insulation layers (102, 103) are aligned; and rigid substrates (11, 12) and flexible substrate (13) are aligned as well. At that time, the folded section of flexible substrate (13) is arranged between first insulation layer (102) of rigid substrate (11) and first insulation layer (102) of rigid substrate (12). Flexible substrate (13) and each base 101 are spaced so as not to touch each other to provide a gap as discussed with respect to FIG. 3 (the gap is not shown in FIGS. 8A-8I). First insulation layers (102, 103) are each made of, for example, a prepreg with a thickness in the range of 20-50 μm, and non-flexible base material (101) is made of, for example, a glass-epoxy base material with an approximate thickness of 100 μm.

Next, as shown in FIG. (8B), between first insulation layer (102) of rigid substrate (11) and first insulation layer (102) of rigid substrate (12), separator (150) (which was cut in the process with reference to FIG. (6)) is placed to join the two first insulation layers. After arranging separator (150), the back surface of the structure formed with the top surface of the folded section of flexible substrate (13) and the surfaces of first insulation layers (102), and the front surface of the structure formed with the surface of the separator (150) and the surfaces of first insulation layers (103), are both flat. Then, on the surfaces of first and second insulation layers (102, 103), conductive films (214, 215) made of, for example, a copper foil are disposed respectively.

Next, as shown in FIG. (8C), the above entire structure is pressure-pressed. The pressure-pressing is conducted using, for example, hydraulic pressing equipment, under the approximate conditions of temperature 200° C., pressure 40 kgf and pressing time 3 hours. By such pressing, resin (111) (FIG. 3) is squeezed out from the prepreg forming first insulation layers (102, 103), and the gap between non-flexible base material (101) and flexible substrate (13) is filled with resin (111). In doing so, each tip of flexible substrate (13) is sandwiched between first insulation layers (102, 103) of rigid substrate (11, 12) respectively. As such, by filling the gap with resin (111), flexible substrate (13) and non-flexible base material (101) are more securely adhered.

Also, non-flexible base material (101), first insulation layers (102, 103) and flexible substrate (13) are arranged so that flexible substrate (13) is positioned between rigid substrates (11, 12), and then are pressed by sandwiching them with conductive films (214, 215). Accordingly, flexible substrate (13), including bending portions (130a-130h), is accommodated between rigid substrates (11, 12), especially in a space (R4) between non-flexible base material (101) and first insulation layers (102, 103) of each of rigid substrates (11, 12).

Furthermore, after pressing, the above entire structure is heated or the like to cure the prepreg forming first insulation layers (102, 103) and resin (111) (FIG. 3) so that both will be integrated. At that time, as the temperature rises, coverlays (138, 139) of flexible substrate (13) and resin (111) of insulation layers (102, 103) are polymerized. Through the polymerization of resin (111) of insulation layers (102, 103), the surroundings of vias (112, 113) (FIG. 3) that are formed later are secured with resin (111), thus enhancing the connection reliability between vias (112, 113) and conductive layers (132, 133).

Next, using, for example, CO2 laser processing equipment, a CO2 laser is beamed at the above structure to form IVHs (Interstitial Via Holes). Then, after a predetermined prior treatment, using, for example, a laser or the like, vias (112, 113) are formed to connect flexible substrate (13) (more specifically, its conductive layers (132, 133)) and rigid substrates (11, 12) respectively. Furthermore, through a predetermined plating process (for example, desmearing or panel plating), copper plating is performed on the surfaces of the entire structure. By doing so, as shown in FIG. (8D), conductive films (214a, 215a) are formed on the entire structure including the interiors of vias (112, 113). During the plating process, since flexible substrate (13) is covered with conductive films (214, 215), it is not directly exposed to the plating solution. Thus, flexible substrate (13) will not be damaged by the plating solution.

As shown in FIG. (8E), conductive films (214a, 215a) are then patterned. By doing so, conductive layers (132, 133), extended patterns (114a, 115a) and wiring patterns (114b, 115b), shown earlier in FIG. (3), are each formed. At that time, as shown in FIG. (8E), conductive film remains at the tip portions of first insulation layers (102, 103).

Next, as shown in FIG. (8F), on each surface of the structure, second insulation layers (104, 105) are disposed and conductive films (224, 225) are further disposed on insulation layers (104, 105). Insulation layers (104, 105) are formed with, for example, a prepreg made by impregnating glass cloth with resin. Also, conductive films (224, 225) are made of, for example, a copper foil. As shown in FIG. (8G), using, for example, hydraulic pressing equipment, the above entire structure is then pressure-pressed. By such pressing, resin is squeezed out from the prepreg forming second insulation layer (104), filling the interiors of vias (112, 113) and the gap between non-flexible base material (101) and the folded section with such resin.

Next, copper plating is performed on the surfaces of the entire structure by half-etching of conductive films (224, 225), drilling (for example, laser drilling after the prior treatment), and panel plating (such as plating after removing smears). In doing so, as shown in FIG. (8H), vias (122, 123) are formed, and conductive films (214a, 215a) are also formed on the entire structure including the interiors of vias (122, 123). After half-etching, through a predetermined photoetching process, conductive films (214a, 215a) are patterned. By doing so, conductors (124a, 125a) and conductive patterns (124b, 125b) are each formed as shown in FIG. (3).

Figure 8I:
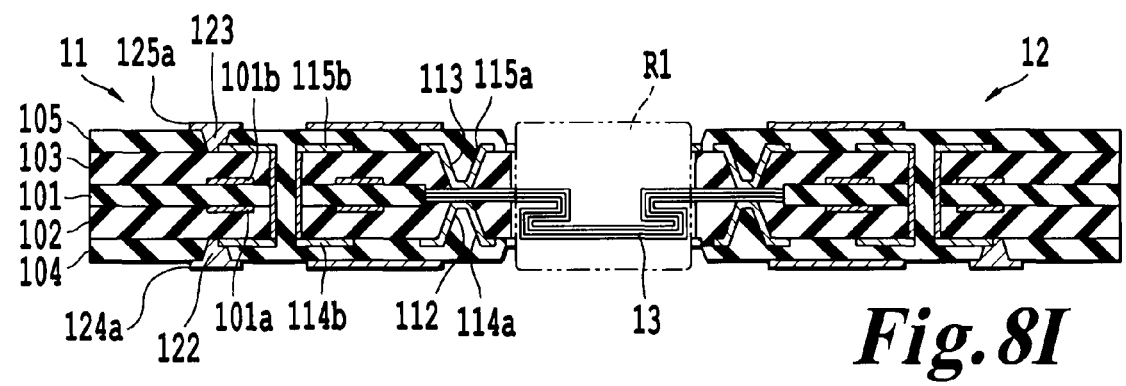
Figure 11:
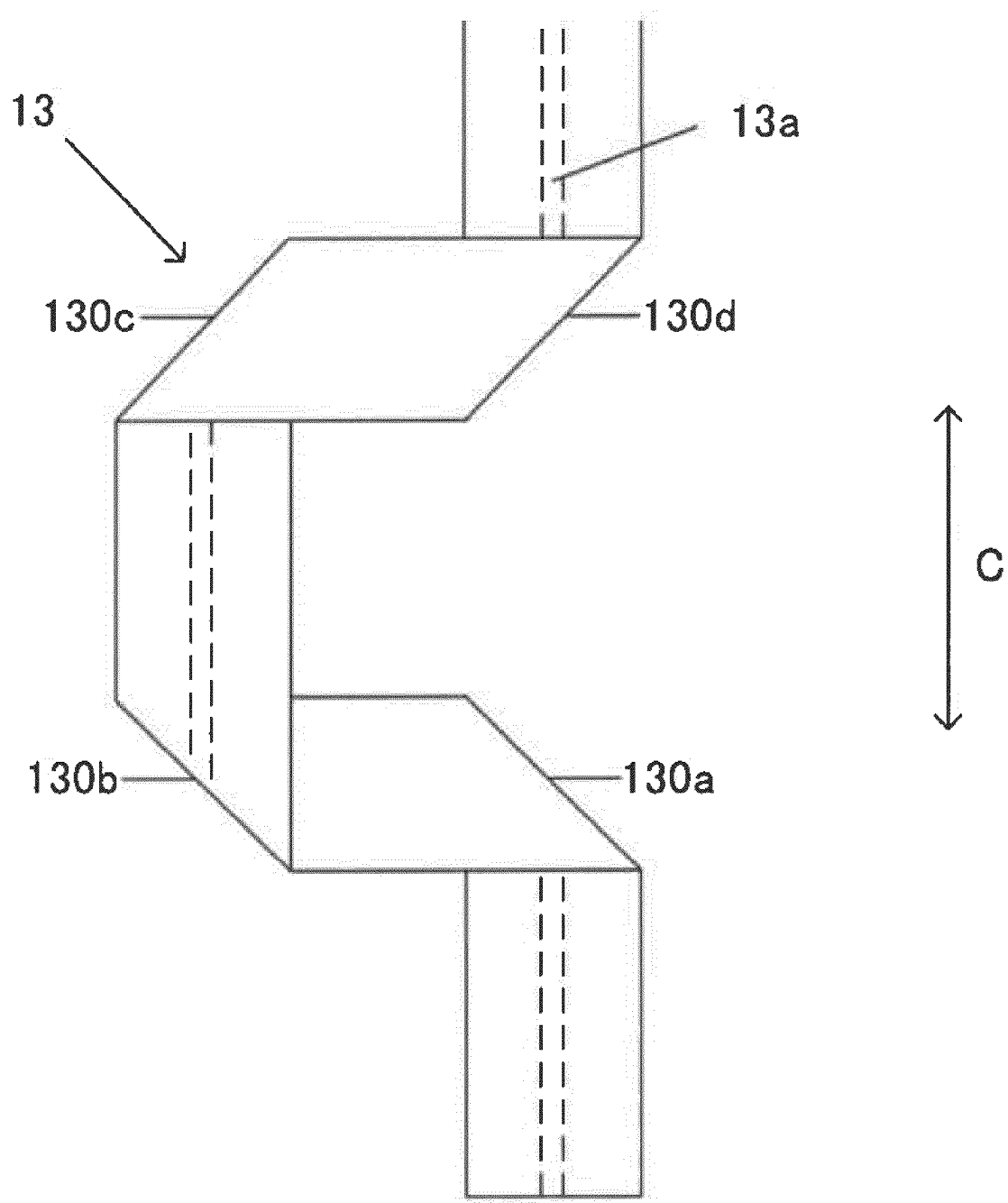
FIG. 11 is a view illustrating yet another example of a flexible substrate.
Figure 12:
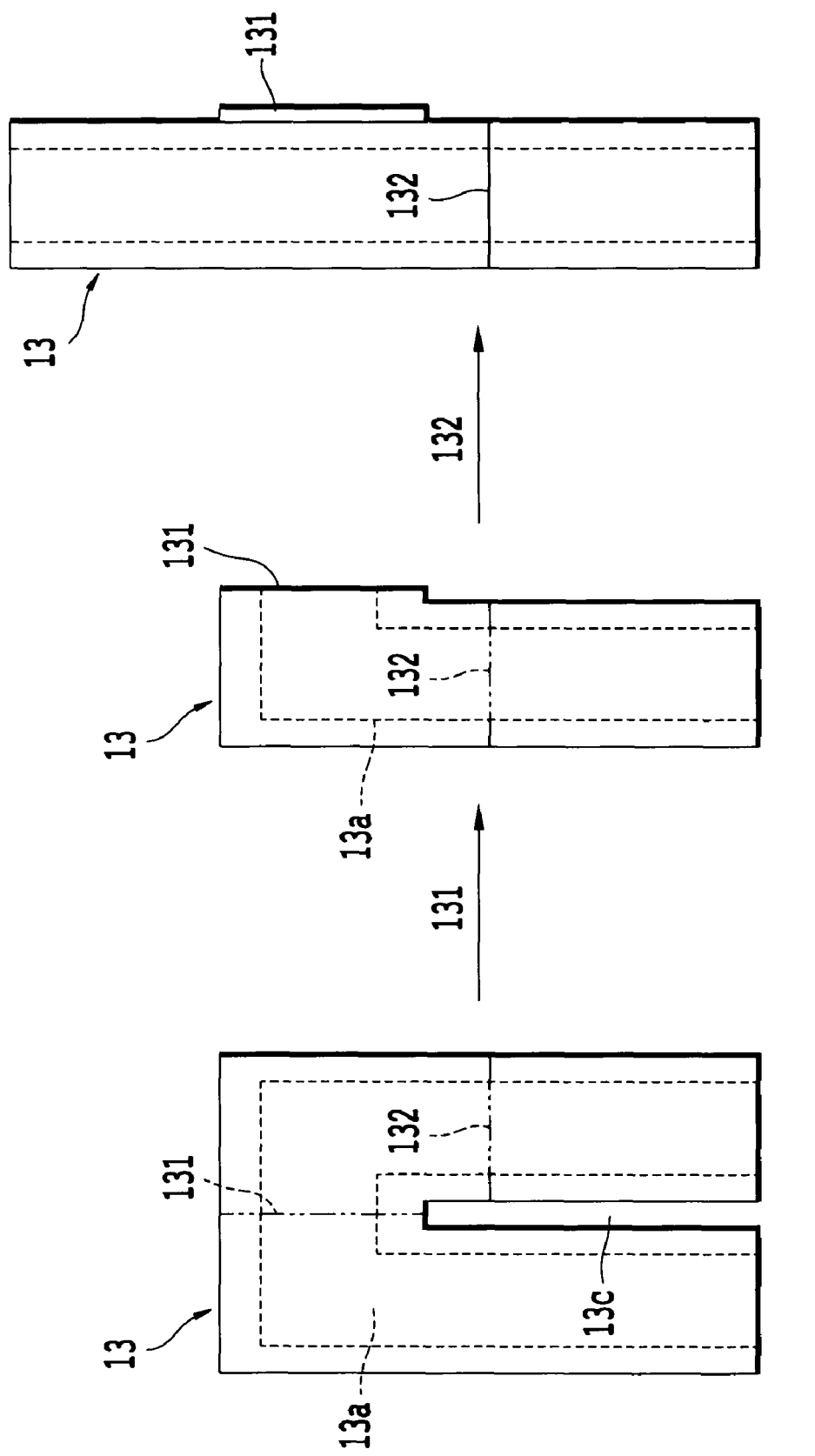
FIG. 12 is a view illustrating yet another example of a flexible substrate.
Figure 13:
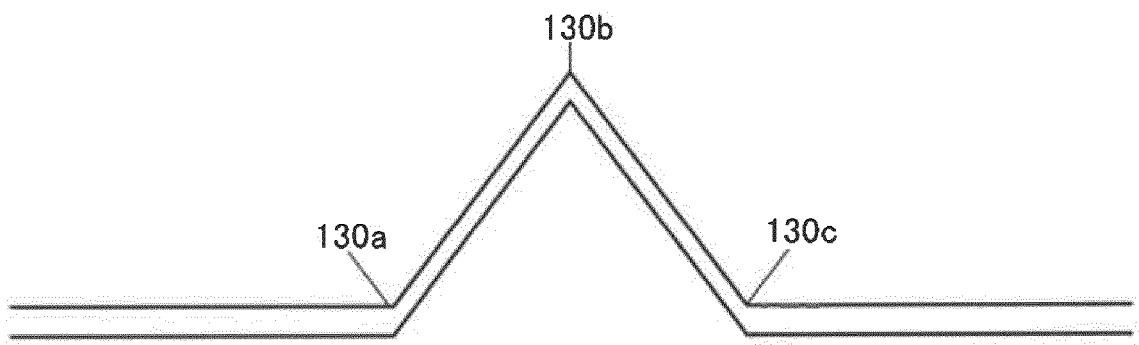
FIG. 13 is a view illustrating yet another example of a flexible substrate.

Then, using, for example, laser processing equipment, a laser such as a CO2 laser is beamed to drill holes in the joint sections between rigid substrates (11, 12) and flexible substrate (13). Each structure (such as separator (150)) on the front and back of the folded section of flexible substrate (13) separated by the holes is removed by peeling the structure from flexible substrate (13). By doing so, as shown in FIG. (8I), flex-rigid wiring board (10) is completed in which flexible substrate (13), including its folded section, is accommodated between first and second rigid substrates (11, 12), namely, space (R1) (FIGS. 1A, 1B, 8I). As the size of material removed to form space R1 is based on the accommodation space of the flexible substrate, folding the flexible substrate to occupy a smaller space can reduce material waste.

A method of manufacturing a flex-rigid wiring board according to the embodiment described above may have the following effects.

(6) One method of manufacturing flex-rigid wiring board (10) includes manufacturing a flex-rigid wiring board formed with two or more rigid substrates (rigid substrates (11, 12)) having a non-flexible base material (non-flexible base material (101)), and a flexible substrate (13) that connects rigid substrates (11, 12) with each other. This method includes the following steps: a first step (FIG. 4) to form multiple bending portions (bending portions 130a-130h) in flexible substrate (13); a second step (FIG. 5) to form a predetermined accommodation space by removing part of insulative material (first insulation layer 102) which is formed on the back and front of non-flexible base material (101) as part of rigid substrates (11, 12); and a third step (FIG. 8C) to accommodate flexible substrate (13), including its bending portions (130a-130h) formed in the first step (FIG. 4), between rigid substrates (11, 12) (space R1) by using the space between non-flexible base materials (101) of rigid substrates (11, 12) and the accommodation space formed in the second step (FIG. 5). According to such a manufacturing method, using the above accommodation space, flexible substrate (13) along with its bending portions (130a-130h) may be accommodated properly in a small space between non-flexible base materials (101) of rigid substrates (11, 12). With this embodiment, the amount of non-flexible base material needlessly removed decreases, and more products may be manufactured per unit of material.

(7) In the third step (FIG. 8C) of a method for manufacturing flex-rigid wiring board (10), non-flexible base material (101), first insulation layers (102, 103) and flexible substrate (13) are arranged in such a way (see FIG. 8B) that flexible substrate (13) is positioned between rigid substrates (11, 12) and then pressed by sandwiching them between conductive films (224, 225). Accordingly, flexible substrate (13), including its bending portions (130a-130h), is accommodated between rigid substrates (11, 12), especially in space (R4) formed between non-flexible base material (101) and first insulation layers (102, 103) of each of rigid substrates (11, 12). By doing so, flexible substrate (13) may be more securely accommodated in space (R1) between rigid substrates (11, 12).

(8) In the first step (FIG. 4) of a method for manufacturing flex-rigid wiring board (10), bending portions (130a-130h) (namely, the folded section) is formed only on the back of flexible substrate (13). Prior to the pressing in the third step (FIG. 8C), regarding the front and back of flexible substrate (13), there is a step (FIG. 8B) to arrange a predetermined spacer (separator (150)) in the front where bending portions (130a-130h) are not formed. By using such separator (150), the back surface of the structure formed with the top surface of the folded section and the surfaces of first insulation layers (102), and the front surface of the structure formed with the surface of separator (150) and the surfaces of first insulation layers (103), are both made flat (see FIG. 8B). Accordingly, such pressing may be properly performed.

(9) In a method of manufacturing flex-rigid wiring board (10), after the above third step (FIG. 8C), there is a step to form a third insulative material (second insulation layer 104) and a fourth insulative material (second insulation layer 105) which cover each of the back and front of the above structure after the pressing. In doing so, the thickness of the insulation films on the front and back of non-flexible base material (101) increases, and thus flexible substrate (13) may be more securely accommodated in space (R1) between rigid substrates (11, 12).

The above embodiment may be practiced by modifying it as follows.

As shown in FIG. (9), shield layers (136, 137) regarding electromagnetic waves on the front and back of flexible substrate (13) may be removed partially at bending portions (130a-130h). By removing shield layers (136, 137), bending flexible substrate (13) becomes easier, thus facilitating the bending process to form bending portions (130a-130h). Even if shield layers (136, 137) are not removed, almost the same effect may be expected by forming them with a thinner film.

Alternatively, flexible substrate (13) itself may be made partially thinner at its bending portions (130a-130h). By doing so, the bending process may also become easier.

It is also effective to form flexible substrate (13) (especially non-flexible base material 101) with aramid resin. Using aramid resin, the bending process becomes easier.

To prevent wiring breakage, wiring (13a) (FIG. 1B) may be made partially wider at bending portions (130a-130h).

If the flexible substrate is structured with two layers like an air-gap-type flexible substrate, bending portions (130a-130h) (namely, the folded section) may be formed in its front and back as shown in FIG. (10). In such a case, by removing part of both insulation layers (102, 103) to form a predetermined accommodation space, the pressing process (FIG. 8C) described earlier may be properly conducted without using separator (150).

In the embodiment discussed above, flexible substrate (13) was folded and folded back at its bending portions parallel to the direction in which it is connected with rigid substrates (11, 12). That is, while the flexible substrate is bent to form overlapped portions as seen in the side view of FIG. 1A, the flexible substrate generally extends in a straight line when viewed from a planar view as shown in FIG. 1B. However, flexible substrate (13) may be folded and folded back at its bending portions to make a certain angle with the direction toward the joints with substrates (11, 12). For example, as shown in FIG. (11), at bending portions (130a-130h), flexible substrate (13) may be folded and folded back an even number of times (such as four times) to make an angle of 90 degrees with the direction "C" in which it is connected with rigid substrates (11, 12). Even with such a structure, impacts, for example, an impact of being dropped, may be eased at the folded section. The folding angles may be set freely according to requirements. For example, instead of 90 degrees, 30 or 60 degrees may be set as well.

Flexible substrate (13) may have one or more cuts and by folding at its bending portions using those cuts, it may be extended in a direction opposite from the folded portion. For example, as shown in FIG. (12), U-shaped flexible substrate (13) may be used in which cut (13c) is prepared and wiring pattern (13a) is formed along cut (13c). In such a case, flexible substrate (13) is folded first at bending portion (131) and then folded back at bending portion (132) so that the substrate may be extended in the opposite direction from bending portion (132). Even with such a structure, impacts such as an impact of being dropped may be eased at the folded section. Moreover, using the cuts, the folded section may be formed more easily.

Flexible substrate (13) may also be of the type that does not have a folded section. For example, as shown in FIG. (13), bending portions (130a-130c) may be shaped like a mountain peak.

In the above embodiment, flex-rigid wiring board (10) having single flexible substrate (13) was shown. However, any number of flexible substrates may be included in a flex-rigid wiring board. Namely, multiple flexible substrates may be used.

In the above embodiment, two rigid substrates (11, 12) were connected by a flexible substrate (13). However, three or more rigid substrates may be connected by a forked flexible substrate (13).

The structure of flex-rigid wiring board (10) may be modified properly according to usage. For example, in the above embodiment, an example was shown in which wiring patterns are formed on both the front and back surfaces of flex-rigid wiring board (10). However, flex-rigid wiring board (10) may have a wiring pattern only on either its front or back surface (one side).

An objective is to provide a flex-rigid wiring board and its manufacturing method that can make as many products as possible per unit of material.

In flex-rigid wiring board (10) having rigid substrates (11, 12) and flexible substrate (13) that connects the rigid substrates (11, 12) with each other, a folded section made up of bending portions (130a-130h) is formed in flexible substrate (13). Then, flexible substrate (13), including its folded section, is accommodated in a space (R1) between rigid substrates (11, 12).

Obviously, numerous modifications and variations of the present invention are possible in light of the above teachings. It is therefore to be understood that within the scope of the appended claims, the invention may be practiced otherwise than as specifically described herein.

What is claimed is:

1. A flex-rigid wiring board, comprising:
   a first rigid substrate having a side edge surface which extends between opposing planar surfaces of the first rigid substrate;
   a second rigid substrate having a side edge surface which extends between opposing planar surfaces of the second rigid substrate and is arranged at a distance from the first rigid substrate such that a space is defined between facing portions of the side edge surfaces of the first and second rigid substrates respectively; and
   a planar flexible substrate comprising:
      a first tip portion connected to the first rigid substrate,
      a second tip portion connected to the second rigid substrate such that the first and second rigid substrates are connected to each other by way of the flexible substrate, and
      multiple bending portions formed between the first and second tip portions of the flexible substrate such that the planar flexible substrate forms a tortuous path between the first and second substrates and is entirely provided in the space defined between the side surfaces of the first and second rigid substrates.

2. The flex-rigid wiring board according to claim 1, wherein:
   the first rigid substrate comprises a first rigid base material having opposing surfaces, and an insulative layer provided on each of the opposing surfaces of the first rigid base material,
   the second rigid substrate comprises a second rigid base material having opposing surfaces, and an insulative layer provided on each of the opposing surfaces of the second rigid base material,
   the first tip portion is anchored between the insulative layers of the first rigid substrate with the first rigid base material serving as a spacer between such insulative layers, and
   the second tip portion is anchored between the insulative layers of the second rigid substrate with the second rigid base material serving as a spacer between such insulative layers.

3. The flex-rigid wiring board according to claim 2, wherein the first and second rigid base material each has a thickness substantially equal to a thickness of the flexible substrate.

4. The flex-rigid wiring board according to claim 1, wherein the multiple bending portions form a folded section wherein planar surfaces of the flexible substrate contact each other.

5. The flex-rigid wiring board according to claim 4, wherein the planar flexible substrate is folded and folded back an even number of times at the bending portions such that a plurality of folded sections are formed in said space.

6. The flex-rigid wiring board according to claim 5, wherein the planar flexible substrate is folded and folded back an even number of times in a direction parallel to the direction in which the planar flexible substrate is connected with the rigid substrates.

7. The flex-rigid wiring board according to claim 5, wherein the planar flexible substrate is folded and folded back an even number of times at the bending portions to provide a predetermined angle with a direction in which the planar flexible substrate is connected with the rigid substrates.

8. The flex-rigid wiring board according to claim 7, wherein the planar flexible substrate is folded and folded back an even number of times at the bending portions to provide an angle of 90 degrees with a direction in which the planar flexible substrate is connected with the rigid substrates.

9. The flex-rigid wiring board according to claim 1, wherein the planar flexible substrate has at least one cut, and by folding and folding back at the bending portions using the at least one cut, the flexible substrate is extended in a direction opposite from the folded section.

10. The flex-rigid wiring board according to claim 1, wherein the planar flexible substrate has a shield layer for shielding electromagnetic waves on its front and back and the shield layer is removed or made thinner at the bending portions.

11. A method for manufacturing a flex-rigid wiring board having a plurality of rigid substrates and a flexible substrate connecting at least two of the plurality of rigid substrates, the method comprising:
providing a planar flexible substrate having a predetermined length;
providing a rigid base material having an insulative material on a surface of the rigid base material wherein a predetermined accommodation space is provided by an opening part of the insulative material which exposes a portion of the rigid base material, having a length that is less than the predetermined length of the planar flexible substrate;
providing multiple bending portions in the planar flexible substrate to form a tortuous path;
accommodating the planar flexible substrate formed as the tortuous path, in the predetermined accommodation space; and
removing the exposed portion of the rigid base material to form a plurality of separated rigid substrates with the planar flexible substrate, formed as the tortuous path, provided within a space between the respective rigid base materials of the plurality of separated rigid substrates.

12. The method for manufacturing a flex-rigid wiring board according to claim 11, further comprising
arranging each one of opposing tips of the planar flexible substrate to be adjacent with the rigid base material of a respective rigid substrate such that, the insulative material, corresponding to each rigid substrate overlaps the rigid base material and the flexible substrate and the flexible substrate is positioned between the plurality of rigid base materials, and
pressing by sandwiching the arrangement to accommodate the flexible substrate, including its bending portions, between the plurality of rigid substrates, in a space formed between the rigid base material and the insulative material of each of the rigid substrates.

13. The method for manufacturing a flex-rigid wiring board according to claim 12, further comprising:
arranging the bending portions such that the tortuous path extends on either a front or a back of the flexible substrate; and
arranging a predetermined spacer either in the front or the back where the tortuous path does not extend.

14. The method for manufacturing a flex-rigid wiring board according to claim 12, further comprising:
forming a second insulative material on an opposite side of the rigid base material and having another predetermined accommodation space;
arranging a predetermined spacer either in a front or a back where the tortuous path does not extend; and
forming a third insulative material and a fourth insulative material that cover the back and front of the arrangement after the pressing.

15. The method for manufacturing a flex-rigid wiring board according to claim 11 wherein forming the tortuous path comprises folding and folding back the planar flexible substrate an even number of times at the bending portions.

16. The method for manufacturing a flex-rigid wiring board according to claim 15 wherein said folding and folding back comprises folding and folding back in a direction parallel to a direction in which the flexible substrate is connected with the plurality of rigid substrates.

17. The method for manufacturing a flex-rigid wiring board according to claim 15 wherein said folding and folding back comprises folding and folding back at the bending portions to incline at a predetermined angle with a direction in which the flexible substrate is connected with the plurality of rigid substrates.

18. The method for manufacturing a flex-rigid wiring board according to claim 17, wherein said folding and folding back comprises folding and folding back at the bending portions to incline at an angle of 90 degrees with a direction in which the flexible substrate is connected with the plurality of rigid substrates.

19. The method for manufacturing a flex-rigid wiring board according to claim 11, further comprising:
providing at least one cut in the flexible substrate, and
folding and folding back at the bending portions using the at least one cut to extend the flexible substrate in a direction opposite from the tortuous path.

20. The method for manufacturing a flex-rigid wiring board according to claim 11, further comprising providing an electromagnetic shield layer on each of a front and back side of the flexible substrate, wherein the shield layer is removed or made thinner at the bending portions.

* * * * *